(12) United States Patent
Sundar (10) Patent No.: US 7,813,832 B2
(45) Date of Patent: Oct. 12, 2010

(54) METHOD FOR ON THE FLY POSITIONING AND CONTINUOUS MONITORING OF A SUBSTRATE IN A CHAMBER

(75) Inventor: Satish Sundar, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 155 days.

(21) Appl. No.: 11/923,516

(22) Filed: Oct. 24, 2007

(65) Prior Publication Data

US 2008/0077271 A1 Mar. 27, 2008

Related U.S. Application Data

(62) Division of application No. 11/040,625, filed on Jan. 22, 2005, now abandoned.

(51) Int. Cl.
*G06F 7/00* (2006.01)
*B65G 49/07* (2006.01)

(52) U.S. Cl. ............. 700/218; 414/222.02; 414/222.04; 414/936

(58) Field of Classification Search ................. 700/112, 700/114, 117, 121, 218; 414/217, 222.02, 414/222.04, 744.5, 754, 935, 936; 702/85, 702/94, 95, 105
See application file for complete search history.

(56) References Cited

U.S. PATENT DOCUMENTS

| | | | |
|---|---|---|---|
| 4,944,650 A | 7/1990 | Matsumoto | |
| 5,980,194 A | 11/1999 | Freerks et al. | |
| 6,032,512 A | 3/2000 | Li | |
| 6,275,742 B1 * | 8/2001 | Sagues et al. | 700/213 |
| 6,298,280 B1 | 10/2001 | Bonora et al. | |
| 6,327,517 B1 * | 12/2001 | Sundar | 700/245 |
| 6,336,204 B1 | 1/2002 | Jevtic | |
| 6,463,782 B1 | 10/2002 | Shen et al. | |
| 6,471,464 B1 * | 10/2002 | Fay et al. | 414/783 |
| 6,496,746 B2 | 12/2002 | Jevtic | |
| 6,516,244 B1 * | 2/2003 | Yoo et al. | 700/218 |
| 6,556,887 B2 | 4/2003 | Freeman et al. | |
| 6,558,509 B2 | 5/2003 | Kraus et al. | |

(Continued)

OTHER PUBLICATIONS

Non-Final Office Action for U.S. Appl. No. 11/040,625 mailed on Sep. 20, 2007; 7 pages.

(Continued)

*Primary Examiner*—Charles R Kasenge
(74) *Attorney, Agent, or Firm*—Townsend and Townsend and Crew (57) ABSTRACT

A method and apparatus for positioning a substrate in a substrate processing chamber. The method includes placing the substrate on a substrate transfer blade, moving the substrate transfer blade to a first position located in a transfer chamber, and capturing at least one image that includes at least a portion of the substrate transfer blade and at least a portion of the substrate. The method also includes processing the image to determine a position of a predetermined portion of the substrate transfer blade and a position of predetermined portion of the substrate. The method further includes determining an offset between the position of the predetermined portion of the substrate transfer blade and the position of the predetermined portion of the substrate, and moving the substrate transfer blade to a second position located in the substrate processing chamber, wherein the second position is adjusted to account for the offset.

19 Claims, 10 Drawing Sheets

U.S. PATENT DOCUMENTS

| | | |
|---|---|---|
| 6,582,175 B2 | 6/2003 | Cox et al. |
| 6,630,995 B1 * | 10/2003 | Hunter .................... 356/237.5 |
| 7,039,501 B2 * | 5/2006 | Freeman et al. ............. 700/258 |
| 7,225,044 B2 | 5/2007 | Hiatt et al. |
| 2002/0021959 A1 * | 2/2002 | Schauer et al. ........... 414/744.2 |
| 2003/0083776 A1 * | 5/2003 | Schauer et al. .............. 700/218 |
| 2003/0113187 A1 | 6/2003 | Lei et al. |
| 2004/0158347 A1 | 8/2004 | Sha et al. |
| 2006/0167583 A1 | 7/2006 | Sundar |

OTHER PUBLICATIONS

Final Office Action for U.S. Appl. No. 11/040,625 mailed on May 15, 2008; 7 pages.

Non-Final Office Action for U.S. Appl. No. for 11/040,625 mailed on Sep. 4, 2008; 7 pages.

Final Office Action for U.S. Appl. No. for 11/040,625 mailed on Feb. 18, 2009; 8 pages.

* cited by examiner

METHOD FOR ON THE FLY POSITIONING AND CONTINUOUS MONITORING OF A SUBSTRATE IN A CHAMBER

CROSS-REFERENCES TO RELATED APPLICATIONS

This application is a division of U.S. patent application Ser. No. 11/040,625, filed Jan. 22, 2005, the disclosure of which is hereby incorporated by reference for all purposes.

BACKGROUND OF THE INVENTION

This present invention relates generally to semiconductor manufacturing equipment. More specifically, the present invention relates to controlling the position of a semiconductor substrate during processing. Merely by way of example, the invention has been applied to centering a semiconductor wafer inside a processing chamber. The method and apparatus can be applied to other applications as well such as positioning of disk drive substrates, flat panel display substrates, mechanical substrates, and the like.

The processing of semiconductor wafers to form integrated circuits and the like generally requires a number of sequential processing steps. Generally, these processes include steps to create devices, conductors, and insulators on the substrate. Often, these processes are performed in a number of processing chambers, each chamber dedicated to a single process. Some semiconductor processing systems utilize a central transfer chamber to couple these dedicated processing chambers, forming a "cluster tool." Examples of these cluster tools include the families of PRODUCER®, CENTURA®, AND ENDURA® processing systems available from Applied Materials, Inc., of Santa Clara, Calif.

Generally, a cluster tool includes a central transfer chamber that houses a robot to facilitate transfer of the substrate between the surrounding processing chambers. This central transfer chamber is generally coupled to at least one load lock chamber and one or more processing chambers. In some cluster tools, multiple robots are located in the central transfer chamber to facilitate the transfer of semiconductor wafers from the load lock chambers to the processing chambers. Generally, semiconductor wafers are stored in wafer cassettes and transferred to the central transfer chamber via the load locks in preparation for processing. The processing chambers are typically utilized to perform various processing steps such as etching, physical vapor deposition, chemical vapor deposition, ion implantation and the like. During wafer transfer operations, semiconductor wafers are supported on moveable wafer transfer blades.

In order to accurately place the semiconductor wafers in a given processing chamber, control over the wafer handling and transfer process is typically exercised by the cluster tool. As the size of semiconductor device features has decreased, processing tolerances have become more stringent and the accuracy requirements for wafer handling have increased. For example, in some processing steps, the placement tolerance for positioning the wafer in the processing chamber has been reduced to smaller dimensions.

Accurate placement of the semiconductor wafers in the processing chambers may be hindered by a variety of factors. For example, thermal expansion of the components that make up the wafer transfer blades may shift the position of the semiconductor wafer from a desired position. Additionally, motion of the wafer transfer blades may result in the semiconductor wafer sliding on the wafer transfer blade during motion of the wafer transfer blade. Consequently, the placement position of the semiconductor wafer inside the processing chamber may be inaccurate.

Several methods and apparatus have been utilized to determine the position of wafer transfer blades and other components of a robotic transfer system. In one approach, the position of a wafer is determined by measuring a reference position of a robot utilized to transfer a wafer between chambers of a semiconductor manufacturing system. However, although the position of a robot and an associated wafer transfer blade may be accurately determined, the position of a semiconductor wafer supported by such a wafer transfer blade may be unknown. For example, although a semiconductor wafer may be accurately positioned on a wafer transfer blade at the location where the wafer is removed from the wafer cassette, the wafer may slide during the movement of the robotic assembly through the load lock and transfer chamber. In fact, sliding of the wafer on the wafer transfer blade may cause the wafer to become misaligned in an undetermined manner. Therefore, in the general case, even though the position of the robot or the wafer transfer blade may be accurately determined and controlled, the position of the semiconductor wafer may be undetermined.

In another approach, an optical emitter that produces a collimated beam of light is disposed on the surface of a transparent cover on the surface of the wafer transfer chamber. Detectors also mounted on the surface of the chamber are tripped when the beam of light is interrupted by either the wafer or the wafer transfer blade. Thus, the system can determine the position of the wafer with respect to the wafer transfer blade. Based on the detected position, the system can correct for wafer position errors. Sensor systems of the type known to be used in this approach are generally accurate to ~5 mils. As semiconductor device dimensions have decreased, increased handling accuracy is desirable, thus providing motivation for wafer handling apparatus with increased accuracy.

Therefore, there is a need in the art for an improved method and apparatus for positioning and continuously monitoring the position of a semiconductor wafer in a processing chamber.

SUMMARY OF THE INVENTION

Embodiments in accordance with the present invention relate generally to semiconductor processing systems. More particularly, embodiments according to the present invention relate to the measurement and control of the position of a semiconductor substrate. In a specific embodiment according to the present invention, a method of centering a semiconductor wafer in a processing chamber is disclosed.

In one embodiment of the method of the present invention, the method includes placing the substrate on a substrate transfer blade, moving the substrate transfer blade to a first position located in a transfer chamber, and capturing at least one image that comprises at least a portion of the substrate transfer blade and at least a portion of the substrate. The method also includes processing the at least one image to determine a position of a predetermined portion of the substrate transfer blade and a position of predetermined portion of the substrate. The method further includes determining an offset between the predetermined portion of the substrate transfer blade and the predetermined portion of the substrate, and moving the substrate transfer blade to a second position located in the substrate processing chamber, wherein the second position is adjusted to account for the offset.

In an alternative embodiment according to the present invention, the method includes providing a substrate support disposed in the substrate processing chamber, providing a plurality of fiducial marks associated with the substrate support, and placing a substrate on the substrate support. The method also includes capturing an image comprising at least one of the plurality of fiducial marks disposed on the substrate support and at least a portion of the substrate, and determining an offset between a predetermined position of the substrate support and a predetermined position of the substrate. The method also includes repositioning the substrate on the substrate support in response to the offset.

DETAILED DESCRIPTION OF THE INVENTION

According to the present invention, semiconductor manufacturing systems are provided. More particularly, the invention provides methods and apparatus for controlling the position of a semiconductor substrate during processing. Merely by way of example, the invention has been applied to centering a semiconductor wafer inside a processing chamber. The method and apparatus can be applied to other applications as well such as positioning of disk drive substrates, flat panel display substrates, mechanical substrates, and the like.

Figure 1:
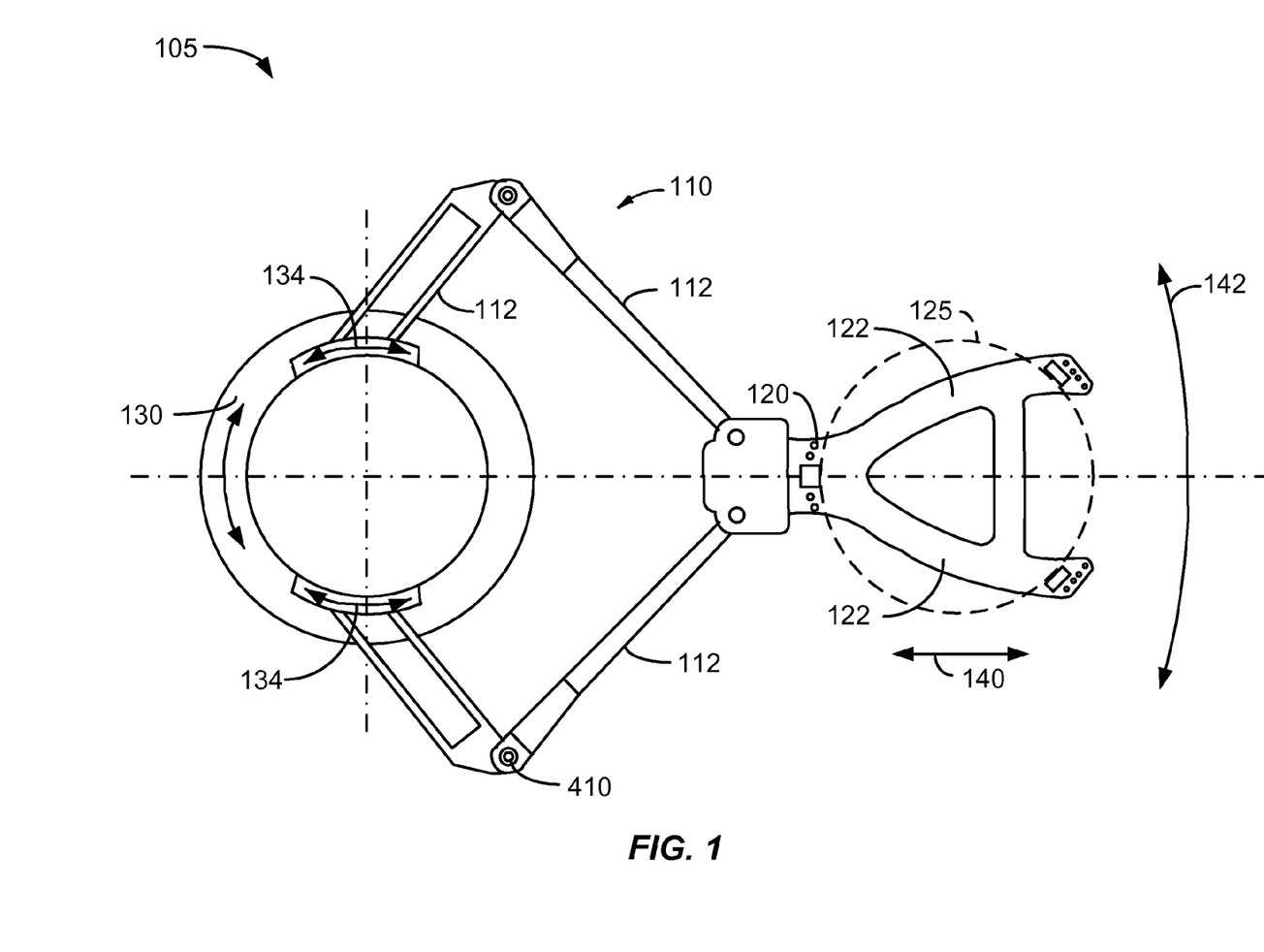
FIG. 1 is a simplified schematic illustration of a substrate positioning apparatus according to an embodiment of the present invention.

FIG. 1 is a simplified schematic illustration of a substrate positioning apparatus 105 according to an embodiment of the present invention. Substrate transfer blade 120 is mechanically coupled to transfer robot 110 with arms 112. Substrate 125 is supported by arms 122 of the substrate transfer blade. In a particular embodiment, the substrate is a semiconductor wafer. Rotation of the robot's base 130 in direction 132 and movement of the robot's arm in directions 134 enable the transfer blade to move in directions 140 and 142.

Figure 2:
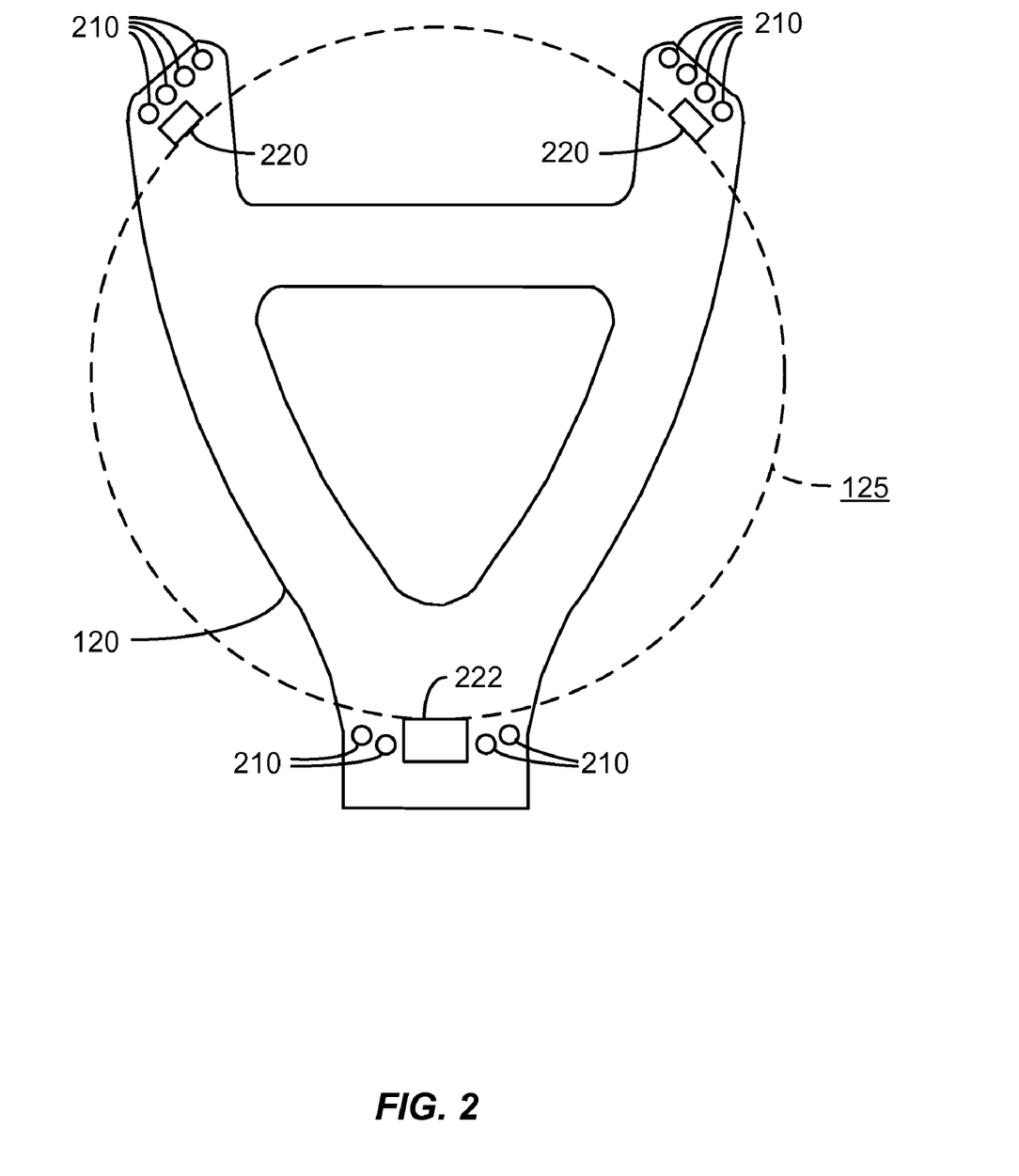
FIG. 2 is a simplified schematic illustration of a top view of a substrate transfer blade according to an embodiment of the present invention.

FIG. 2 is a simplified schematic illustration of top view of a substrate transfer blade 120 according to an embodiment of the present invention. The transfer blade can be made from any suitable material. The suitable material generally has mechanical stability and an ability to be machined accurately. The material should also be compatible with other materials used herein, and be compatible in a working environment. In one embodiment, the transfer blade is made from aluminum, however this is not required by the present invention. Other materials can also be used.

As illustrated in FIG. 2, a predetermined number of fiducial marks 210 are located on the upper surface of the transfer blade. In a specific embodiment, 12 fiducial marks are located on the upper surface of the transfer blade. Alternative embodiments utilize a larger or smaller number of fiducial marks.

In the embodiment illustrated in FIG. 2, the substrate is a generally circular semiconductor wafer 125 illustrated as a dashed circle. The wafer periphery abuts stops 220 and 222 attached to the transfer blade. However, the claimed invention is not limited to substrates in the form of semiconductor wafers. The present invention provides a method and apparatus that is applicable to a variety of substrates. For example, circular and rectangular glass substrates used in the manufacturing of flat panel displays are positioned and monitored in alternative embodiments. Moreover, disk drives and generally shaped mechanical components and parts are additional substrates for which the present invention is applicable.

In an embodiment according to the present invention, the fiducial marks are located at the periphery of the wafer transfer blade, but this is not required. The fiducial marks are generally distinctive and present an optical reflectance signature different than selected portions of the wafer transfer blade. In one embodiment, the fiducial marks are located a predetermined distance from the outer edges of the substrate. For example, in a particular embodiment, the fiducial marks are approximately 5-8 mm from the outer edges of the substrate. In other embodiments, the fiducial marks are a greater or lesser distance. In another specific embodiment, the fiducial marks are located at positions where a substrate that is displaced to the maximum extent allowable by the application, does not obstruct the fiducial marks. In an alternative embodiment, the fiducial marks are located a predetermined distance from the edge of the transfer blade. For instance, the fiducial marks are 5-8 mm from the edge of the transfer blade in a specific alternative embodiment.

In a particular embodiment according to the present invention, the fiducial marks are a series of circular features formed by anodizing pre-selected circular portions of the wafer transfer blade and subsequently removing the anodization. In an alternative embodiment, anodization of a reverse image of the circular fiducial marks followed by removal of the anodized regions is employed to create the fiducial marks.

Figure 3:
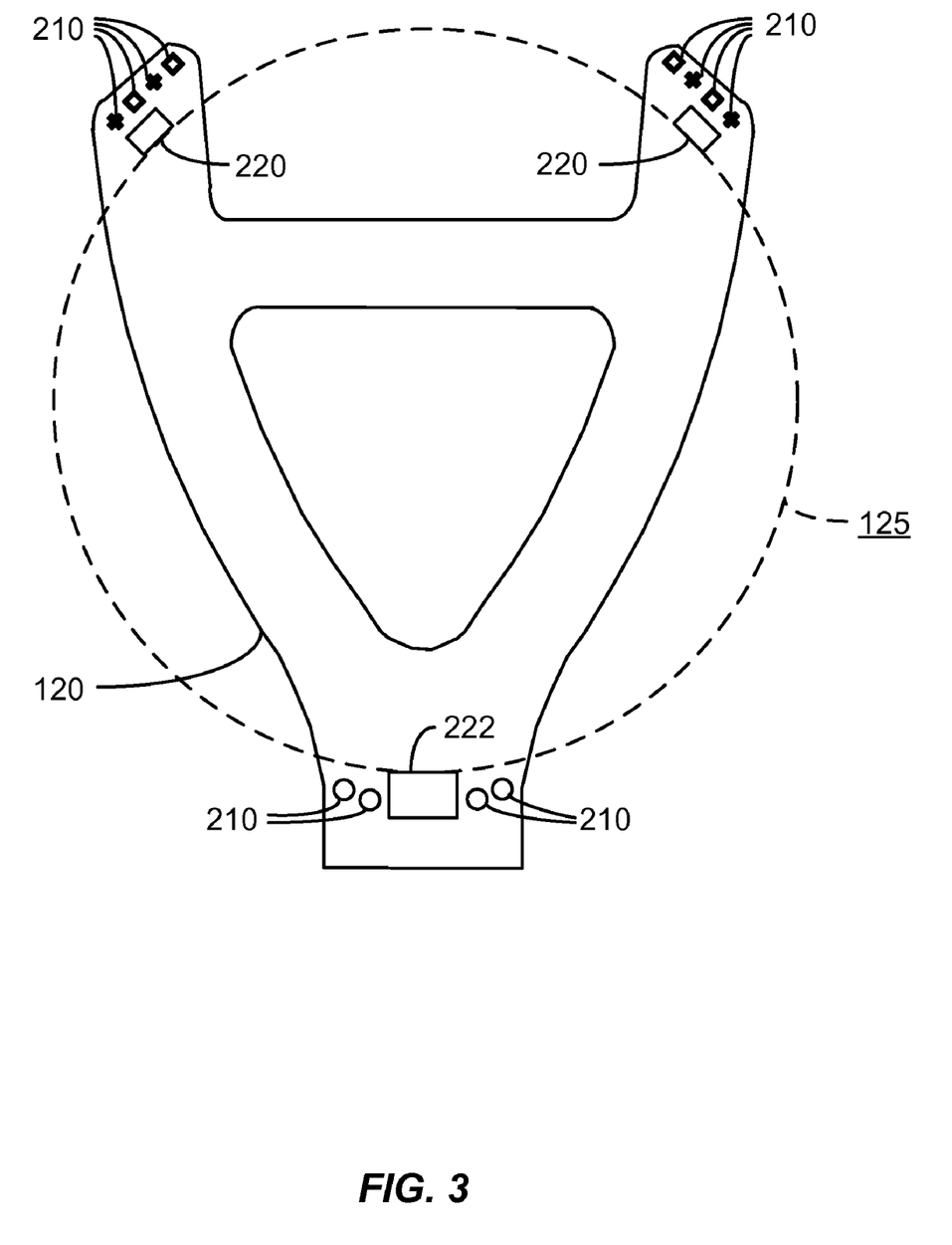
FIG. 3 is a simplified schematic illustration of a top view of a substrate transfer blade according to an alternative embodiment of the present invention.

In yet another alternative embodiment, fiducial marks in the form of alternating geometric patterns are formed on the wafer transfer blade. FIG. 3 illustrates such an alternative embodiment in which alternating crosses and squares are used as fiducial marks.

Figure 4:
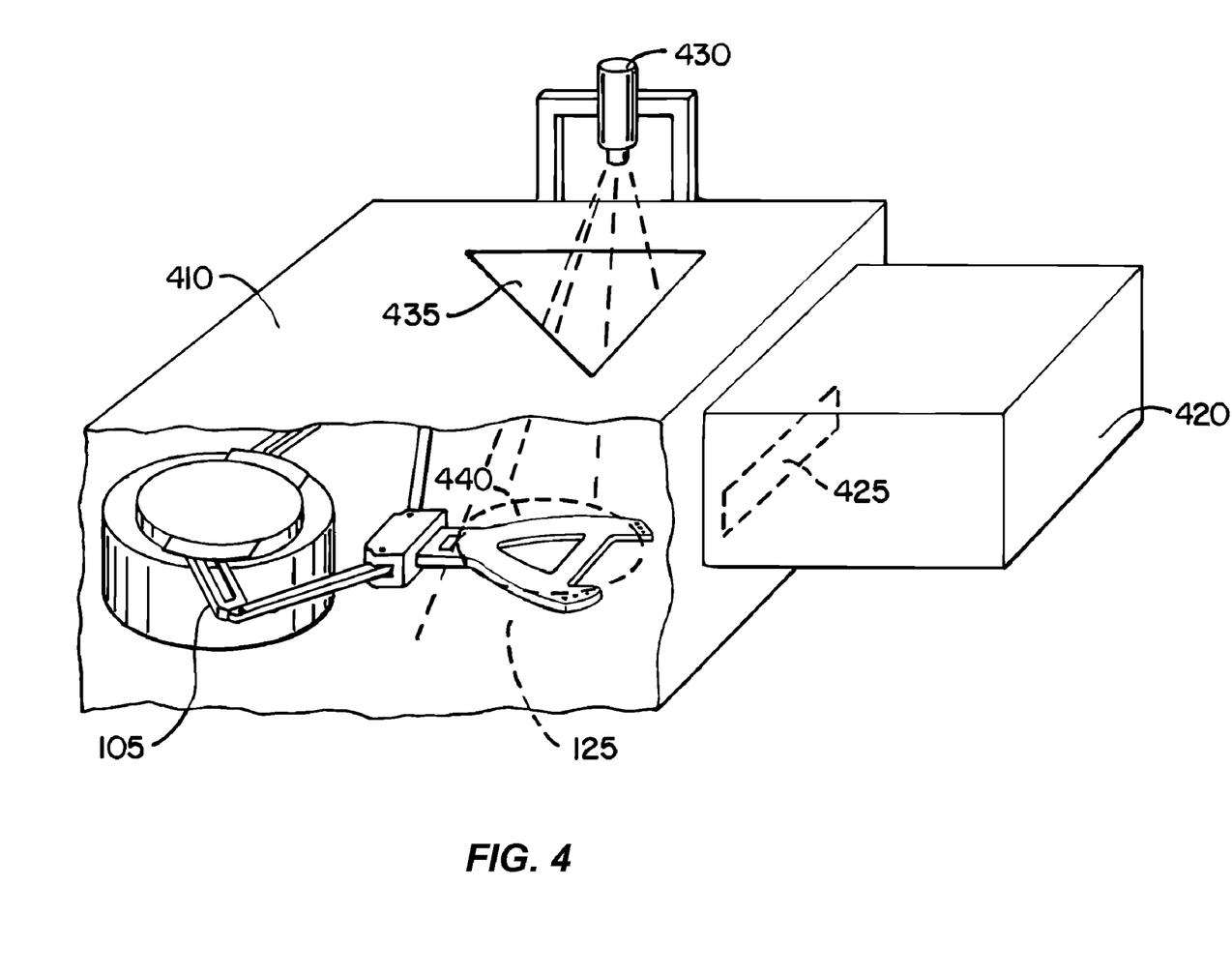
FIG. 4 is a simplified perspective side view of a substrate processing apparatus according to an embodiment of the present invention.

FIG. 4 is a simplified perspective side view of a substrate processing apparatus according to an embodiment of the present invention. Substrate positioning apparatus 105, previously described with reference to FIG. 1, is located in transfer chamber 410. Substrate processing chamber 420 is coupled to the transfer chamber. A slit valve (not shown) is operable to open port 425 so that the substrate 125 can be moved between the transfer chamber and the processing chamber. Optical system 430 is mounted in proximity to transparent window 435 located in the upper surface of the transfer chamber. In this embodiment, the optical system is arranged so that an image of objects present in the transfer chamber is captured by the optical system. For example, the optical system is arranged in one embodiment so that objects present in the field of view 440 are captured by the optical system.

Figure 5:
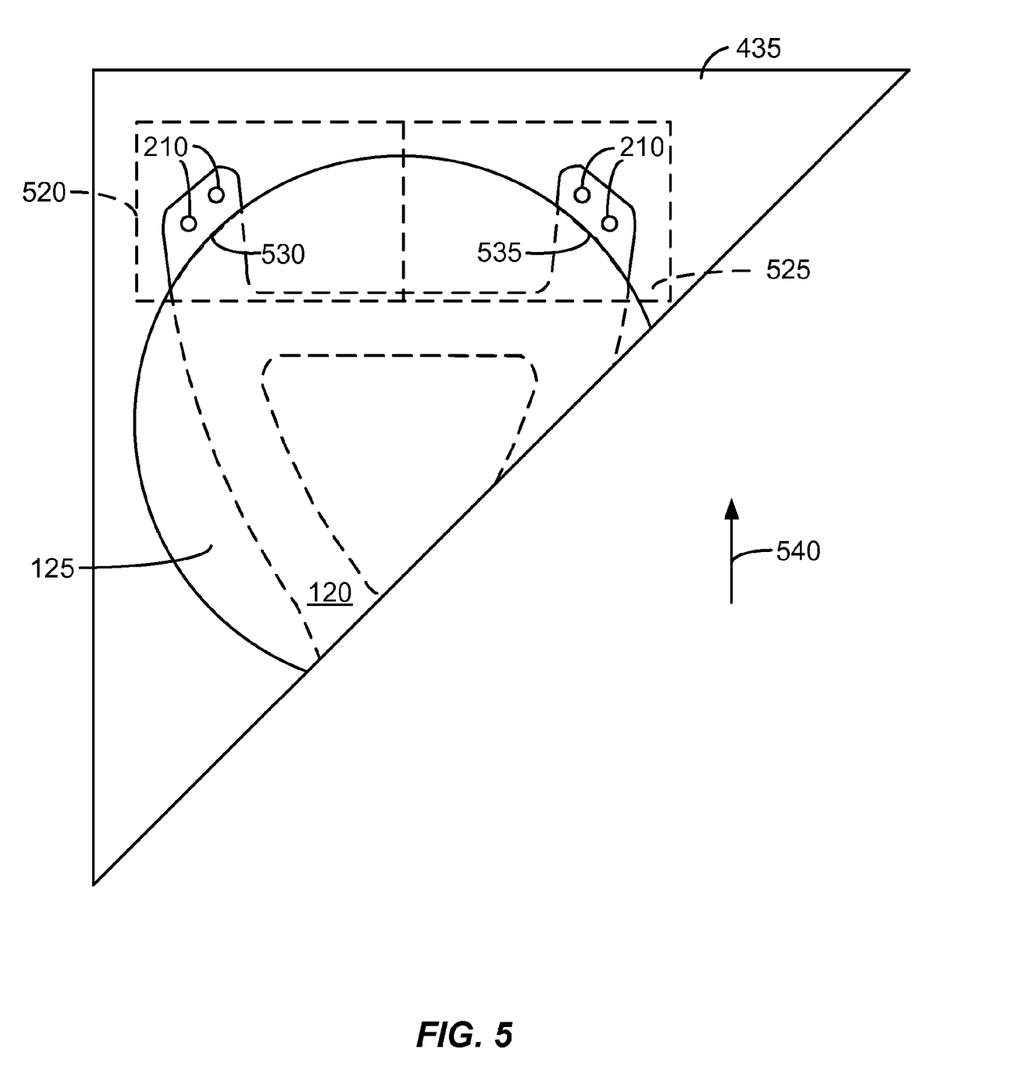
FIG. 5 is a simplified schematic top view of a portion of a transfer chamber according to an embodiment of the present invention.

FIG. 5 is a simplified schematic top view of a portion of the transfer chamber 410 from the perspective of the optical system 430 (not shown). In embodiments according to the present invention, the optical system is calibrated as will be described below. Additionally, the optical system is used to capture at least one image through the window 435 located on the upper surface of the transfer chamber. In the embodiment illustrated in FIG. 5, two images are captured that include a portion of the substrate 125 along with fiducial marks 210 that are present on the transfer blade 120. In the particular embodiment illustrated in FIG. 5, the image contains a left field of view 520 and a right field of view 525.

Images of fields 520 and 525 are processed by computer algorithms known to those of skill in the art to determine the position of a predetermined portion of the transfer blade based on the positions of the fiducial marks 210. Further analysis is performed to determine the position of a predetermined portion of the substrate based on the position of the two arcs 530 and 535 associated with the upper edge of the substrate in the two images, respectively. In a particular embodiment, the predetermined portion of the transfer blade is the center of the transfer blade and the predetermined portion of the substrate is the center of the substrate. Additionally, the offset between these positions is determined and this information is utilized to control the transfer blade in placing the substrate on a substrate support located inside a processing chamber.

In embodiments according to the present invention, the transfer blade is fabricated to known tolerances so that the position of the fiducial marks relative to the geometry of the transfer blade can be determined. For example, the distance from various fiducial marks to the center of the transfer blade is selected prior to manufacturing and can be verified after the completion of manufacturing. Moreover, thermal expansion of the transfer blade can be mapped during operation of the substrate processing system by monitoring the positions of the fiducial marks. For instance, expansion of the transfer blade will result in an increase in the distance between fiducial marks on opposite sides of the transfer blade. This increased distance can be monitored to determine the thermal expansion characteristics of the transfer blade and recalculate the position of the center of the transfer blade.

In embodiments according to the present invention, the calculated offset between the center of the transfer blade and the center of the substrate is utilized during placement of the substrate in the processing chamber. For example, given that the position of the center of the transfer blade relative to the robot arm is known, the substrate can be placed in a desired position in the processing chamber by accounting for the offset between the center of the substrate and the center of the transfer blade. Merely by way of example, a semiconductor wafer could be centered on a substrate support present in a processing chamber.

In alternative embodiments, a set of images that include the top portion of the transfer blade and a set of images that include the bottom portion of the transfer blade are captured. These two sets of images are captured sequentially at locations 520 and 530 as illustrated in FIG. 5. The first set of images is captured as the upper portions of the transfer blade and substrate pass below the transparent window 435 illustrated in FIGS. 4 and 5. As the robot moves the transfer blade in direction 540, the second set of images is captured as the lower portions of the transfer blade and substrate (not shown) pass below the transparent window. Computer analysis is performed to determine the center of the transfer blade and the substrate based on the four images included in these two sets of images. Adjustment of the substrate placement position in the processing chamber is accomplished as described above.

In embodiments according to the present invention, a single video camera with a CCD array is disposed above the transparent window fabricated in the upper surface of the transfer chamber. The transparent window may be made of any suitable material. The suitable material generally possesses a degree of optical transparency and uniformity acceptable for applications of the present invention. Generally, the optical properties of the window are invariant with time and temperature. In an embodiment according to the present invention, the transparent window is made from plexiglass, however this is not required by the present invention. Other materials can also be used. In this embodiment, the video camera is positioned to image at least one location inside the transfer chamber. Merely by way of example, an embodiment according to the present invention positions the camera to image an area 2"×2" in size at a location approximately 5 cm below the transparent surface.

The camera used in an embodiment according to the present invention operates over a predetermined wavelength region and at a predetermined spatial resolution sufficient to capture at least one image that includes a portion of the transfer blade and a portion of the substrate. In a specific embodiment according to the present invention, a camera operating in the visible region of the electromagnetic spectrum with a predetermined pixel size is utilized. Merely by way of example, an embodiment according to the present invention uses a Sony XC-003 ⅓" 3 CCD color camera, with a resolution of 768 (H)×494 (V), available from Sony Electronics, Inc., Sony Business Solutions & Systems Company (BSSC), San Jose, Calif.

In one embodiment, video cameras operating in the visible region of the electromagnetic spectrum are utilized. Visible optical radiation present in the semiconductor manufacturing facility provides illumination for the optical video cameras. In an alternative embodiment, optical radiation in the infrared region of the spectrum is used to illuminate the fiducial marks. Accordingly, in this alternative embodiment, video cameras sensitive to infrared radiation are utilized. In yet another alternative embodiment, an ultraviolet radiation source and corresponding camera is used. The shorter wavelength radiation provided by the ultraviolet source results in a reduction in the diffraction limit achievable with the imaging system. In another alternative embodiment, the radiation source is a combination of ultraviolet, visible, and infrared sources. In this alternative embodiment, appropriate cameras matched to the illumination source are utilized.

The optical system utilized in embodiments according to the present invention is generally calibrated to compensate for optical properties of the transparent window along with other optical system components. For example, the index of refraction associated with the transparent window may vary as a function of position. Additionally, the thickness of the window may vary as a function of position. Accordingly, embodiments according to the present invention utilize a calibration step to compensate for variations in the optical properties of the transparent window.

In a specific embodiment, a substrate featuring a calibration pattern is supported on the transfer blade, which is moved to a location below the transparent window in the transfer chamber. In this specific embodiment, an image is captured of the calibration pattern present on the substrate and processed by computer algorithms to calibrate the camera system. In an alternative embodiment, a series of images are captured of the calibration pattern as the transfer blade is translated through the transfer chamber. For example, the transfer blade can be translated in direction 540 as illustrated in FIG. 5. This series of images is utilized to calibrate the system and to account for variations in the optical system of a smaller or larger scale than that of the calibration field.

Figure 6:
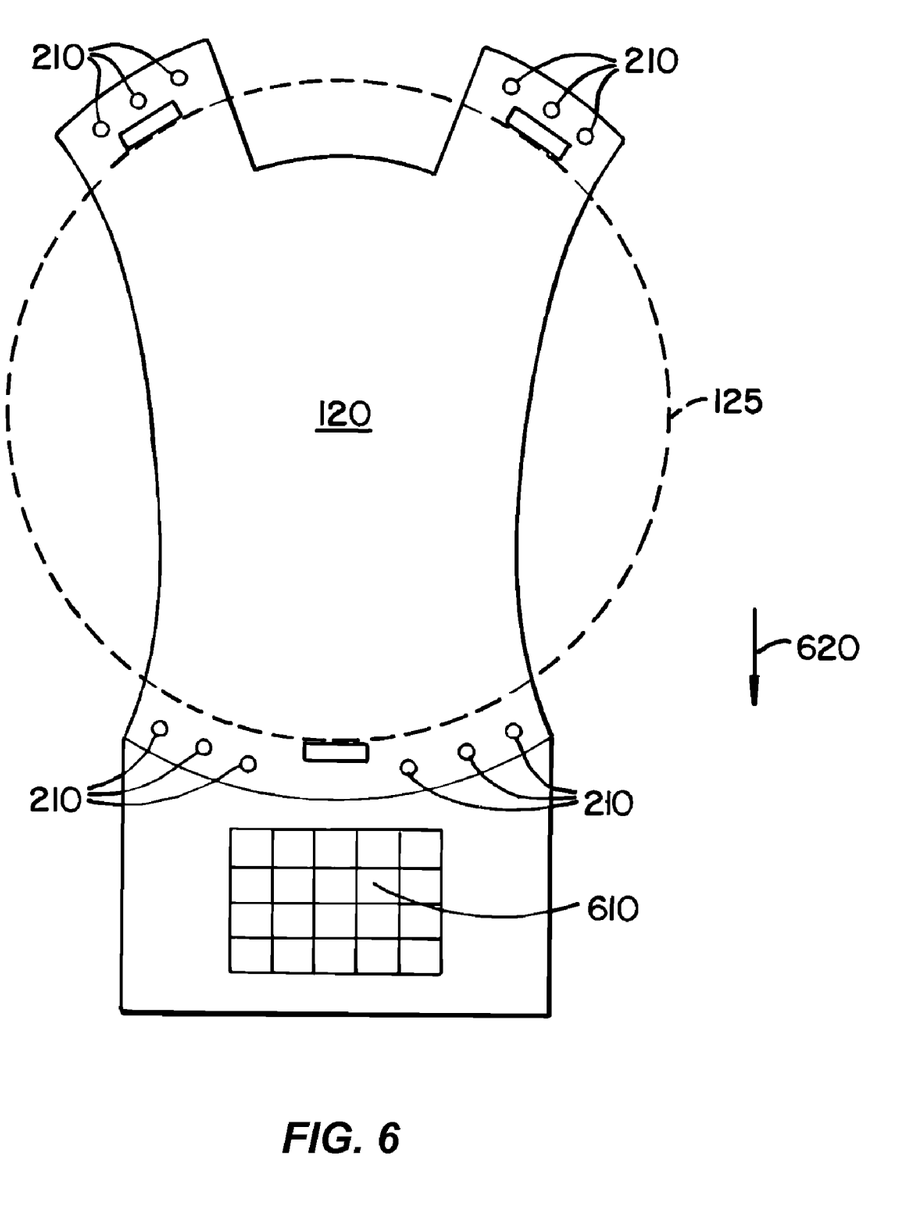
FIG. 6 is a simplified schematic illustration of a transfer blade with an integrated calibration field according to an alternative embodiment of the present invention.

Recalibration of the optical system can be performed as desired. In an embodiment according to the present invention, recalibration is performed after the transfer chamber lid is opened, accidental or deliberate movement of the camera system, or the like. In yet another alternative embodiment, calibration of the optical system is performed by utilizing a calibration field disposed on the transfer blade. FIG. 6 is a simplified schematic illustration of a transfer blade with an integrated calibration field according to an alternative embodiment of the present invention. In this alternative embodiment, the transfer blade is fabricated to include an integrated calibration field on a portion of the transfer blade, the view of which is not obstructed by the substrate. For example, in FIG. 6, the integrated calibration field 610 is located on the transfer blade 120 at a position horizontally displaced in direction 620 from the substrate 125. The optical system captures images of the fiducial marks 210 and the substrate in the manner described above. Additionally, the imaging system captures at least one image of the calibration field for use in system calibration. Multiple images of the calibration field are captured as the transfer blade is moved in yet another alternative embodiment according to the present invention. The multiple images are utilized to account for variations in the optical system of a larger or smaller scale than that of the calibration field. These multiple images are captured as the wafer transfer blade moves through various positions in the transfer chamber.

As mentioned previously, the thermal expansion of the transfer blade can be mapped during operation by monitoring the relative positions of the fiducial marks. This monitoring may be performed in real time to determine the effects of thermal expansion on the robotic assembly and the transfer blade. Data related to thermal expansion and contraction of the mechanical assemblies may be used in selecting the placement location of the substrate inside the processing chamber.

Figure 7:
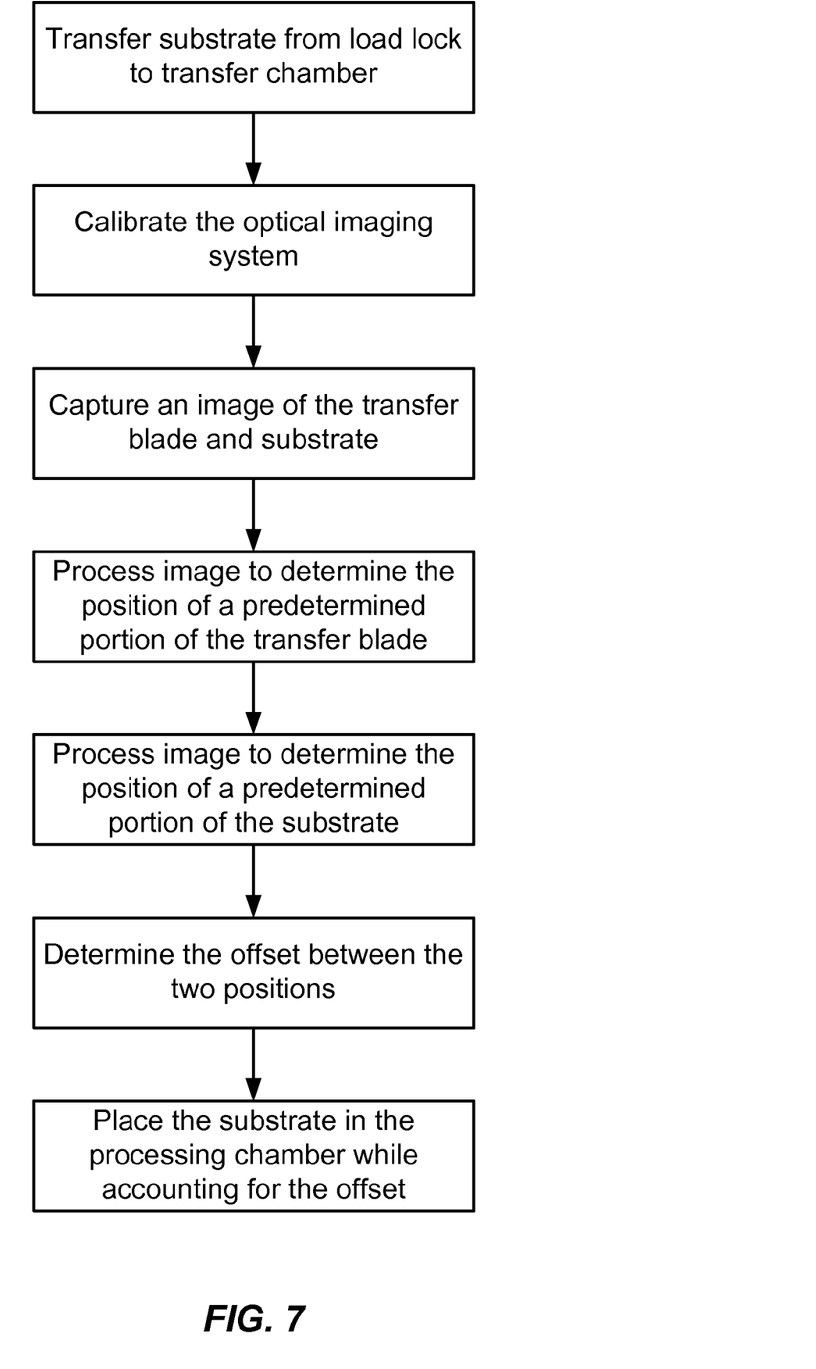
FIG. 7 is a simplified flowchart of a method of positioning a substrate in a substrate processing system in accordance with an embodiment of the present invention.

FIG. 7 is a simplified flowchart of a method of positioning a substrate in a substrate processing system in accordance with an embodiment of the present invention. First, a substrate is transferred from the load lock chamber to the central transfer chamber. The optical imaging system is calibrated to account for any variations in the optical uniformity of the imaging system. Next, at least one image is captured that includes at least a portion of the transfer blade and at least a portion of the substrate. The captured image is processed using computer algorithms to determine the position of a predetermined portion of the transfer blade. In one embodiment, the predetermined portion of the transfer blade is the center of the transfer blade. Additionally, the captured image is processed using computer algorithms to determine the position of a predetermined portion of the substrate. In one embodiment, the predetermined portion of the substrate is the center of the substrate. An offset between the two positions is calculated in the next step. Finally, the transfer blade is moved to a location in the processing chamber. The location is selected to account for the offset previously determined. Thus, the substrate is placed in the processing chamber with increased accuracy.

Figure 8:
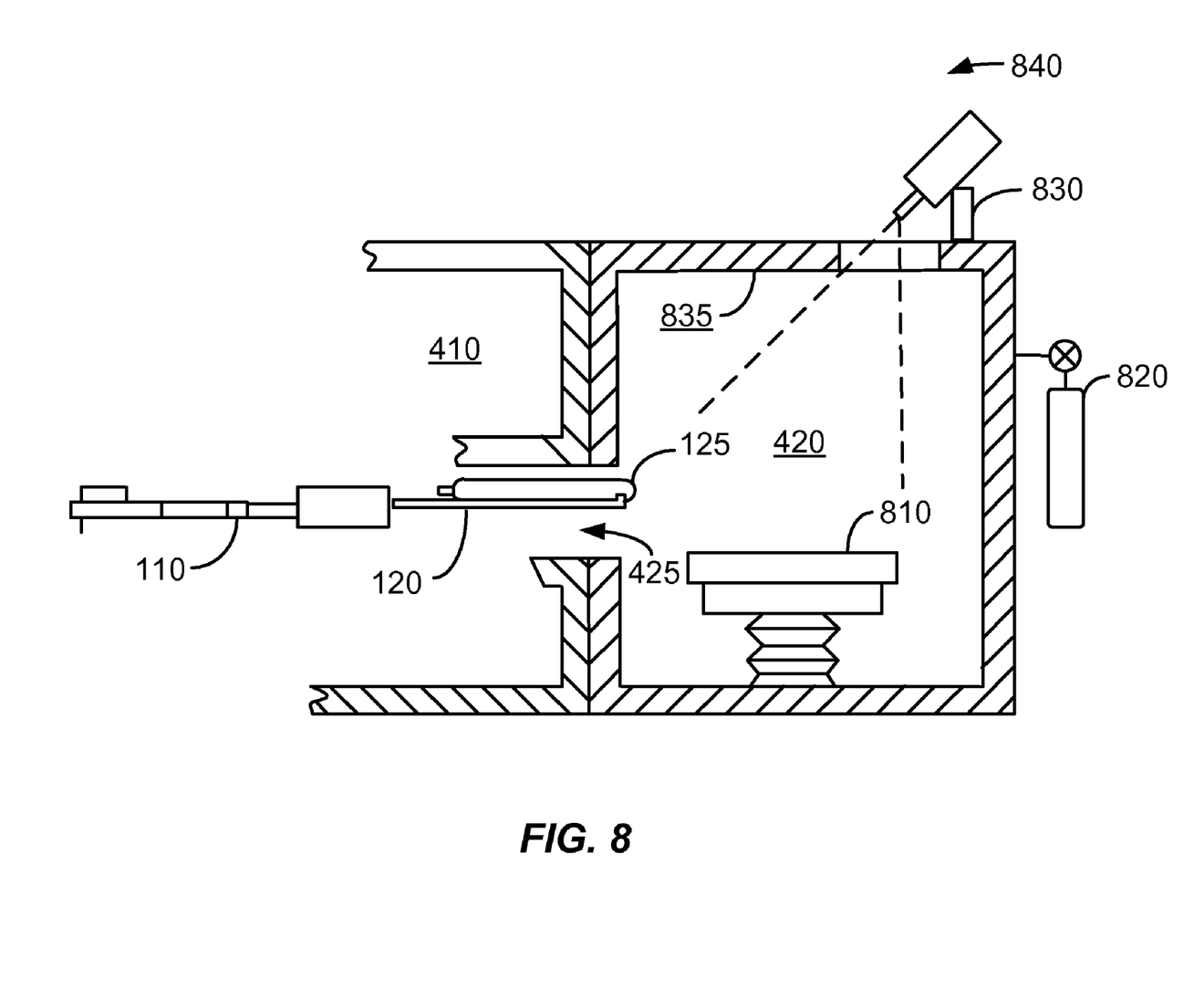
FIG. 8 is a simplified schematic illustration of a portion of a substrate processing system including a processing chamber according to an embodiment of the present invention.

In an alternative embodiment according to the present invention, the substrate position is determined and adjustments to the substrate position are made after the substrate is transferred to the processing chamber. FIG. 8 is a simplified schematic illustration of a portion of a substrate processing system including processing chamber 420. Merely by way of example, a processing chamber suitable for use with the Endura® processing system, manufactured by Applied Materials, of Santa Clara, Calif., is an example of such a processing chamber. However, the present invention is not limited to a particular substrate processing system. Substrate 125, supported on transfer blade 120, is introduced into the processing chamber through port 425 and placed on substrate support 810 by transfer robot 110. Process gases are introduced into the chamber from gas source 820. Chamber temperature is controlled by a heater assembly (not shown). Additional components of the processing chamber are omitted for sake of clarity.

Embodiments as illustrated in FIG. 8 capture at least one image of the substrate after it is placed on the substrate support in the processing chamber. The image includes at least a portion of the substrate and a portion of the components of the processing chamber disposed inside the chamber. For example, in a particular embodiment, the image includes at least a portion of the substrate support. Merely by way of example, specific parts of the substrate support are imaged and used as reference points in determining the relative position of the substrate to the substrate support. For instance, one embodiment according to the present invention captures an image that includes the outer edge of the susceptor or heater. An alternative embodiment captures an image that includes any contrasting marks present on the substrate support, including, but not limited to holes for lift pins and the like. In another embodiment, other components of the processing chamber are utilized as reference points in determining the relative position of the substrate to the substrate support.

The image is processed by computer algorithms known to those of skill in the art to determine the position of a predetermined portion of the components of the processing chamber disposed inside the chamber. Additionally, the image is processed to determine the offset between this position and a predetermined portion of the substrate. In one embodiment, the predetermined portion of the components of the processing chamber disposed inside the chamber is the center of the substrate support and the predetermined portion of the substrate is the center of the substrate. Utilizing the relative offset between the positions of the substrate and the substrate support, the substrate is repositioned at the desired position in the processing chamber by use of the transfer robot. In a specific embodiment, the substrate is repositioned so that it is centered on the substrate support within a predetermined tolerance. For example, in a particular embodiment according to the present invention, the substrate is centered with a tolerance of less than or equal to 1 mil.

In alternative embodiments, particular fiducial marks are placed on the substrate support and utilized to determine the position of the substrate support with respect to the substrate. In embodiments that utilize components of the processing chamber as reference points as well as embodiments that utilize particular fiducial marks located on the substrate support, several of the optical and computational techniques previously described in relation to determining the relative positions of the transfer blade and substrate are applicable.

For image capture purposes in FIG. 8, an optical system is adapted to image through a transparent window located on the surface of processing chamber. In the embodiment illustrated in FIG. 8, a single video camera 840 with a CCD array is disposed above a transparent window 830 located in the upper surface 835 of the processing chamber. In this illustrated embodiment, the window is located in the upper surface of the processing chamber, but this is not required by the present invention. In alternative embodiments, the window is located in a side surface of the processing chamber. In another alternative embodiment discussed below, an optical fiber bundle is utilized, enabling the removal of the window from the processing chamber. Moreover, although a single video camera is illustrated in the embodiment illustrated in FIG. 8, this is also not required by the present invention. Multiple video cameras, multiple still cameras or a single still camera are utilized in other embodiments.

The transparent window may be made of any suitable material. The suitable material generally possesses a degree of optical transparency and uniformity acceptable for applications of the present invention. Generally, the optical properties of the window are invariant with time and temperature. In one embodiment, the transparent window is made from plexiglass, however this is not required by the present invention. Other materials can also be used. In this embodiment, the video camera is positioned to image at least one location inside the processing chamber. Merely by way of example, an embodiment according to the present invention positions the camera to image an area 2"×2" in size.

The camera used in one embodiment of the present invention operates over a predetermined wavelength region and at a predetermined spatial resolution sufficient to capture at least one image that includes a portion of the substrate and a portion of the components of the processing chamber disposed inside the chamber. In a specific embodiment according to the present invention, a camera operating in the visible region of the electromagnetic spectrum with a predetermined pixel size is utilized. Merely by way of example, an embodiment according to the present invention uses a Sony XC-003 ⅓" 3 CCD color camera, with a resolution of 768 (H)×494 (V), available from Sony Electronics, Inc., Sony Business Solutions & Systems Company (BSSC), San Jose, Calif.

The camera utilized in embodiments according to the present invention is generally calibrated to compensate for optical properties of the transparent window and other components of the optical system. For example, the index of refraction associated with the transparent window may vary as a function of position. Additionally, the thickness of the window may vary as a function of position. Accordingly, embodiments according to the present invention utilize a calibration step to compensate for variations in the optical properties of the transparent window.

In one embodiment, a substrate with a calibration pattern present on the upper surface of the substrate is placed on the substrate support disposed inside the processing chamber. Either an image or series of images are captured of the calibration pattern and processed by computer algorithms to calibrate the camera system. Recalibration of the system can be performed as desired. In an embodiment according to the present invention, recalibration is performed after the transfer chamber lid is opened, accidental or deliberate movement of the camera system, or the like.

Figure 9:
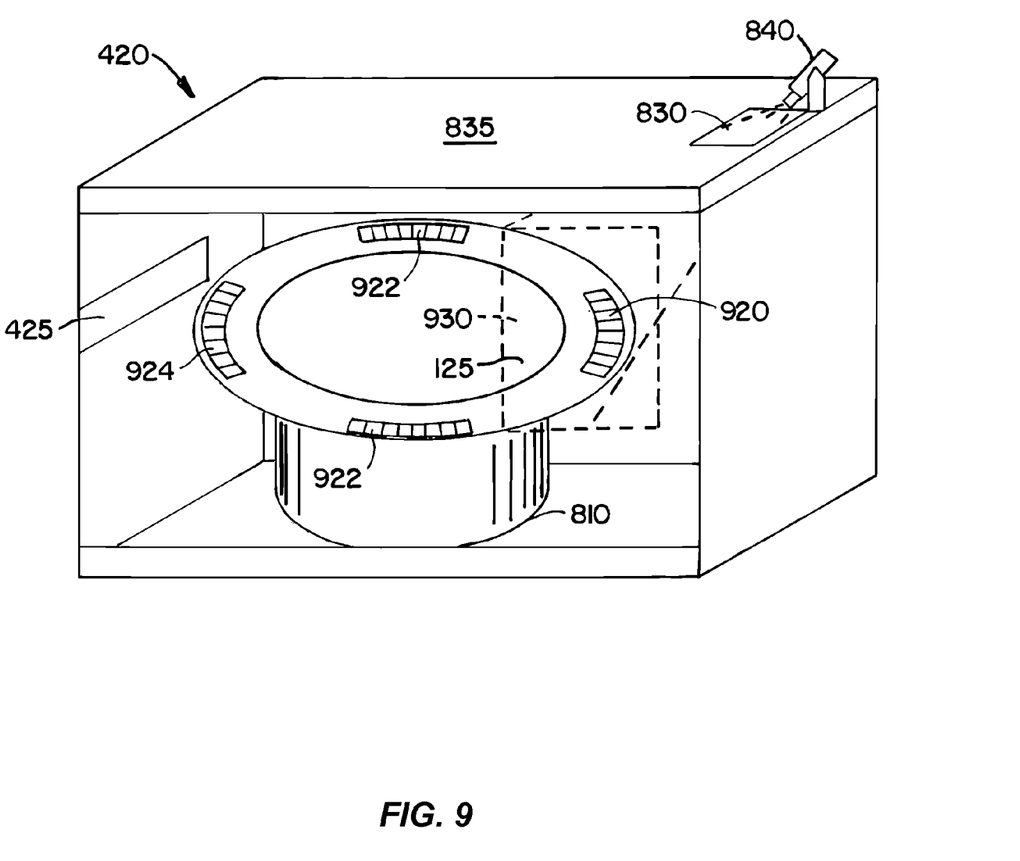
FIG. 9 is a simplified schematic illustration of a perspective cut-away view of a substrate processing chamber and a substrate support with an integrated calibration field according to an embodiment of the present invention.

In another embodiment, calibration of the optical system is performed with the substrate to be processed in place on the substrate support. FIG. 9 is a simplified schematic illustration of a perspective cut-away view of a substrate processing chamber and a substrate support with an integrated calibration field according to an embodiment of the present invention. In the illustrated embodiment, the substrate support is fabricated to include an integrated calibration field on a portion of the substrate support, the view of which is not obstructed by the substrate. For example, in FIG. 9, calibration fields 920, 922 and 924 are located on the substrate support 810 at positions surrounding the periphery of the substrate 125. The calibration field in the embodiment illustrated in FIG. 9 is an optical calibration pattern, but this is not required by the present invention. For example, a combination of optical calibration patterns and physical objects disposed inside the processing chamber could be used for the calibration process. Merely by way of example, well defined, accurately inscribed, or machined geometrical patterns may be used.

Moreover, in other embodiments according to the present invention, calibration of the optical system is not limited to calibration for optical aberrations introduced as a result of the transparent window. For example, foreshortening of the portions of the image closest to the camera results in some embodiments. Foreshortening would occur, for instance, if the optical system imaged through a window in the side of the processing chamber. As illustrated in FIG. 9, calibration field 920, nearest the camera, field 922, at an intermediate distance, and field 924, farthest from the camera, would most likely present different depths of field and magnifications to the optical system. Merely by way of example, adjustment for this foreshortening is accomplished by creating a mapping between the calibration image obtained by the optical system and the known dimensions of components of the processing system present in the chamber. For example, in an embodiment according to the present invention, the dimensions of the substrate support are measured and known prior to the calibration step. After the calibration image is captured, computer algorithms create a transform map between the known element positions and the positions of these elements present in the image. This transform map is utilized in subsequent image processing steps to account for optical aberrations produced by the optical system. Alternative mapping systems could utilize multiple images captured with varied depths of field to further improve the performance of the optical system. Similar transform maps would be produced by calibrating the optical system using calibration patterns present on the surface of a substrate.

In an embodiment according to the present invention, the field of view of the optical system is adjusted to image an area 930 as illustrated in FIG. 9. This image contains portions of the substrate and portions of the calibration field located on the substrate support. The image is processed by computer algorithms to determine the center of the substrate support based on the known positions of the calibration marks 920. Further analysis is performed to determine the center of the substrate based on the substrate circumference included in the image. The offset between the center of the substrate support and the center of the substrate is calculated. Utilizing the relative offset between the positions of the substrate and the substrate support, the substrate is repositioned at the desired position in the processing chamber by use of the transfer blade. In a specific embodiment, the substrate is repositioned so that it is centered on the substrate support within a predetermined tolerance. For example, in a particular embodiment according to the present invention, the substrate is centered with a tolerance of less than or equal to 1 mil.

In an alternative embodiment according to the present invention, the camera 840 and window 830 shown in FIG. 9 are replaced with an optical fiber bundle. The optical input side of the fiber bundle is introduced into the processing chamber through the chamber surface 835 at the location where the window 830 is shown in FIG. 9. The use of a fiber bundle in this embodiment allows for the removal of the window. Light provided by an optical source (not shown) and reflected off the substrate and substrate support travels through the fiber bundle to an optical camera external to the processing chamber, producing an image of a portion of the substrate and a portion of the substrate support. Image processing, as described above, is utilized to calibrate the optical system and to determine the offset between a predetermined portion of the substrate and a predetermined portion of the substrate support. In a particular embodiment according to the present invention, the predetermined portion of the substrate is the center of the substrate and the predetermined portion of the substrate support is the center of the substrate support.

One of the benefits provided by the use of the optical fiber bundle is increased flexibility in the placement of the optical system components. Embodiments according to the present invention utilizing an optical fiber bundle place the camera and other components of the optical system in a location separate from the substrate processing system.

Figure 10:
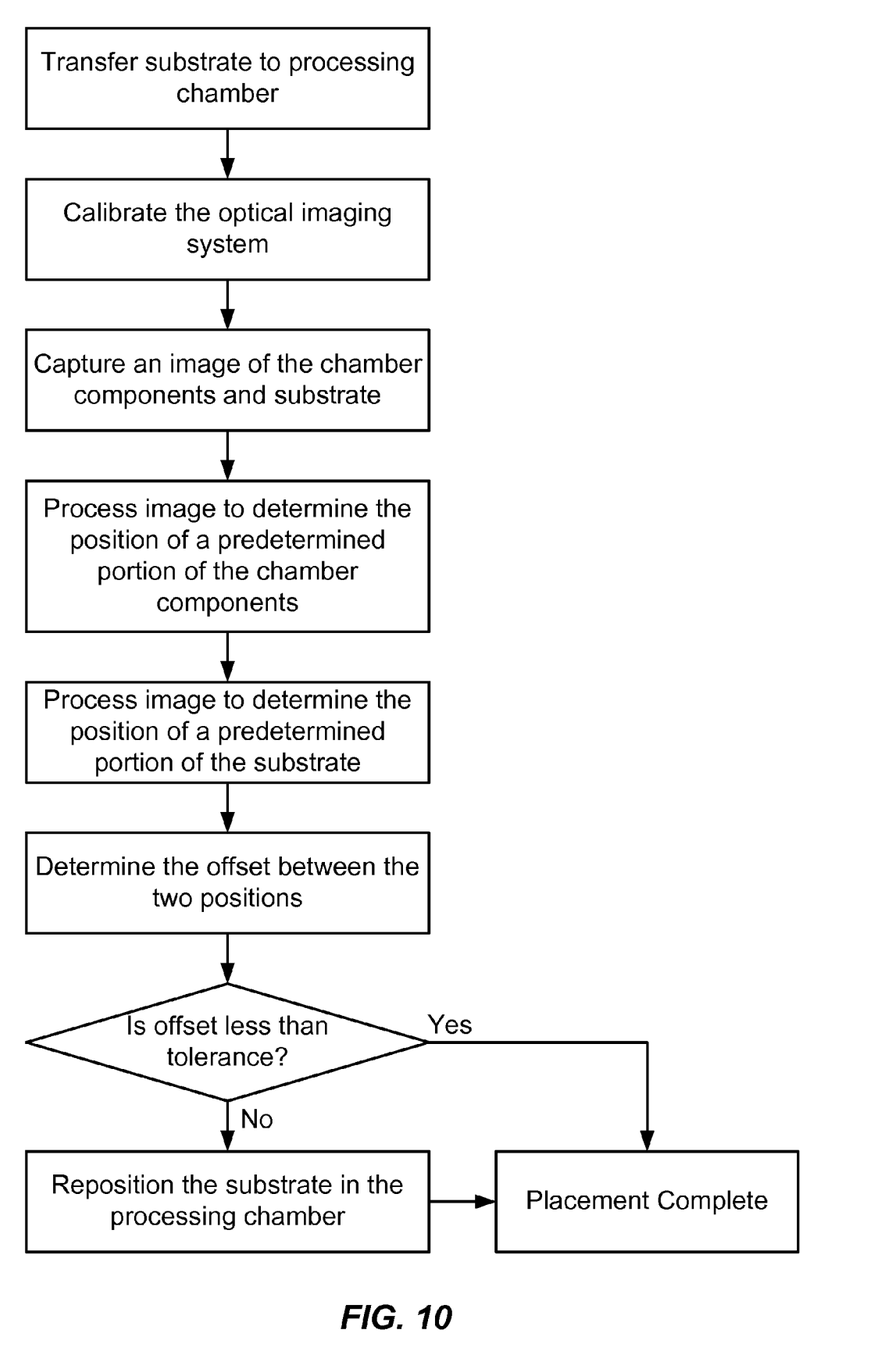
FIG. 10 is a simplified flowchart of a method of positioning a substrate in a processing chamber in accordance with an alternative embodiment of the present invention.

FIG. 10 is a simplified flowchart of a method of positioning a substrate in a processing chamber in accordance with an embodiment of the present invention. First, a substrate supported by a transfer blade is transferred to a processing chamber by a transfer robot and placed on a substrate support disposed inside the processing chamber. The optical system is calibrated to account for variations in the optical uniformity of the optical system. Next, at least one image is captured that includes at least a portion of the components of the processing chamber disposed inside the chamber and at least a portion of the substrate. The captured image is processed using computer algorithms to determine the position of a predetermined portion of the components. In one embodiment, the predetermined portion of the components is the center of the substrate support. Additionally, the captured image is processed using computer algorithms to determine the position of a predetermined portion of the substrate. In one embodiment, the predetermined portion of the substrate is the center of the substrate, which is a semiconductor wafer. An offset between the two positions is calculated in the next step. If the offset exceeds a system tolerance, the transfer blade is utilized to reposition the substrate at a predetermined location on the substrate support. After repositioning, in one embodiment according to the present invention, the steps of the method starting with system calibration are repeated to verify the placement location of the substrate. Thus, the substrate is repositioned in the processing chamber with increased accuracy.

While the above is a complete description of specific embodiments of the invention, the above description should not be taken as limiting the scope of the invention as defined by the claims.

What is claimed is:

1. A method of positioning a substrate in a substrate processing chamber, the method comprising:
   moving the substrate to a first position located in a portion of the substrate processing chamber, wherein the substrate processing chamber includes at least one component comprising a substrate transfer blade;
   capturing at least one image that comprises at least a portion of the at least one component and at least a portion of the substrate;
   processing the at least one image to determine a position of a portion of the at least one component and a position of a portion of the substrate;
   determining, using the determined position of the portion of the at least one component and the determined position of the portion of the substrate, an offset between the position of the portion of the at least one component and the position of the portion of the substrate; and
   moving the substrate to a second position located in the substrate processing chamber, wherein the second position is adjusted to account for the offset.

2. The method of claim 1 wherein the portion of the substrate processing chamber comprises a transfer chamber.

3. The method of claim 1 wherein the portion of the at least one component is a center of the substrate transfer blade.

4. The method of claim 1 wherein the second position is a position in which the substrate is centered with respect to the substrate transfer blade.

5. The method of claim 1 wherein the portion of the substrate is a center of the substrate.

6. The method of claim 1 wherein the substrate is a semiconductor wafer.

7. The method of claim 1 wherein the at least one component comprises a substrate support disposed in the substrate processing chamber.

8. The method of claim 7 wherein the second position comprises a position on the substrate support.

9. The method of claim 7 wherein the substrate support comprises a plurality of fiducial marks disposed on the substrate support.

10. The method of claim 9 wherein the plurality of fiducial marks include structural features of the substrate support.

11. The method of claim 9 wherein the fiducial marks are geometric shapes located on the substrate support.

12. A method of positioning a substrate in a substrate processing chamber, the method comprising:
    placing the substrate on a substrate transfer blade;
    moving the substrate transfer blade to a first position located in a transfer chamber;
    capturing at least one image that comprises at least a portion of the substrate transfer blade and at least a portion of the substrate;
    processing the at least one image to determine a position of a portion of the substrate transfer blade and a position of a portion of the substrate;
    determining, using the determined position of the portion of the at least one component and the determined position of the portion of the substrate, an offset between the position of the portion of the substrate transfer blade and the position of the portion of the substrate; and
    moving the substrate transfer blade to a second position located in the substrate processing chamber, wherein the second position is adjusted to account for the offset.

13. The method of claim 12 wherein the second position is a position in which the substrate is centered with respect to the substrate transfer blade.

14. The method of claim 12 wherein the step of processing the at least one image comprises the steps of:
    identifying at least one fiducial mark;
    calculating a location of the portion of the substrate transfer blade based on the location of the at least one fiducial mark;
    identifying an outer edge of the substrate; and
    calculating a location of the portion of the substrate.

15. The method of claim 14 wherein the portion of the substrate transfer blade is a center of the substrate transfer blade and the portion of the substrate is a center of the substrate.

16. The method of claim 14 wherein the at least one fiducial mark is fabricated on a peripheral edge of the substrate transfer blade.

17. The method of claim 16 wherein the at least one fiducial marks are three fiducial marks located at a distance of less than 8 mm from a peripheral edge of the substrate when supported by the substrate transfer blade.

18. The method of claim 14 wherein the at least one fiducial mark is a geometric shape characterized by an optical reflectivity greater than a portion of the substrate transfer blade.

19. The method of claim 14 wherein the at least one fiducial mark is a geometric shape characterized by an optical reflectivity less than a portion of the substrate transfer blade.

* * * * *